United States Patent
Nam et al.

(10) Patent No.: US 9,929,729 B2
(45) Date of Patent: Mar. 27, 2018

(54) DRIVING DEVICE OF GATE DRIVER

(71) Applicant: LSIS CO., LTD., Gyeonggi-do (KR)

(72) Inventors: Kyoung-Hun Nam, Gyeonggi-do (KR);
Sung-Hee Kang, Gyeonggi-do (KR);
Jong-Bae Kim, Gyeonggi-do (KR)

(73) Assignee: LSIS CO., LTD., Anyang-si,
Gyeonggi-Do (KR)

( * ) Notice: Subject to any disclaimer, the term of this patent is extended or adjusted under 35 U.S.C. 154(b) by 0 days.

(21) Appl. No.: 15/210,711

(22) Filed: Jul. 14, 2016

(65) Prior Publication Data

US 2017/0019099 A1 Jan. 19, 2017

(30) Foreign Application Priority Data

Jul. 15, 2015 (KR) .................. 10-2015-0100628

(51) Int. Cl.
| H03B 1/00 | (2006.01) |
| H03K 3/00 | (2006.01) |
| H03K 17/567 | (2006.01) |
| H03K 17/082 | (2006.01) |
| H03K 17/0812 | (2006.01) |
| H03K 17/16 | (2006.01) |
| H03K 17/18 | (2006.01) |
| H03K 17/689 | (2006.01) |

(52) U.S. Cl.
CPC ....... H03K 17/567 (2013.01); H03K 17/0828 (2013.01); H03K 17/08128 (2013.01); H03K 17/168 (2013.01); *H03K 17/164* (2013.01); *H03K 17/18* (2013.01); *H03K 17/689* (2013.01)

(58) Field of Classification Search
CPC .................. H03K 17/567; H03K 17/08128
USPC .................................................. 327/109
See application file for complete search history.

(56) References Cited

U.S. PATENT DOCUMENTS

| 8,482,328 B2 * | 7/2013 | Kim ..................... H03K 17/168 |
| | | 327/108 |
| 2004/0196678 A1 * | 10/2004 | Yoshimura .......... H02M 7/5387 |
| | | 363/79 |
| 2012/0098577 A1 | 4/2012 | Lobsiger |
| 2013/0293287 A1 | 11/2013 | Zhu |

(Continued)

FOREIGN PATENT DOCUMENTS

| CN | 104078939 A | 10/2014 |
| GB | 2 440 771 A | 2/2008 |
| JP | H2250671 A | 10/1990 |

(Continued)

OTHER PUBLICATIONS

European Search Report dated Nov. 17, 2016 issued in corresponding European Application No. 16 17 3548.

*Primary Examiner* — Metasebia Retebo
(74) *Attorney, Agent, or Firm* — K&L Gates LLP

(57) ABSTRACT

Disclosed embodiments relate to a driving device of a gate driver driving a semiconductor switching element, which may include a gate driver unit for outputting a control signal to the semiconductor switching element, and a control unit for controlling an operation of the semiconductor switching element by operating at least one gate driver configuring the gate driver unit, wherein the control unit operates at least one gate driver based on a preset operation range of the semiconductor switching element and a detected operation status thereof.

13 Claims, 5 Drawing Sheets

(56) References Cited

U.S. PATENT DOCUMENTS

2014/0197869 A1* 7/2014 Watanabe .............. H03K 17/18
327/109
2015/0168484 A1 6/2015 Ratz

FOREIGN PATENT DOCUMENTS

| | | |
|---|---|---|
| JP | H9229972 A | 9/1997 |
| JP | 20038415 A | 1/2003 |
| JP | 200774771 A | 3/2007 |
| JP | 2007074771 A | 3/2007 |
| JP | 200989519 A | 4/2009 |
| JP | 2009522998 A | 6/2009 |
| JP | 2009296732 A | 12/2009 |
| JP | 201182764 A | 4/2011 |
| JP | 2013-258778 | 12/2013 |
| KR | 20000045987 A | 7/2000 |
| KR | 100275037 B1 | 12/2000 |
| KR | 100528674 B1 | 11/2005 |
| KR | 2008-0028807 A | 4/2008 |
| KR | 2012-0071718 A | 7/2012 |
| KR | 1516088 B1 | 4/2015 |
| WO | 2013005443 A1 | 1/2013 |
| WO | 2014129242 A1 | 8/2014 |
| WO | 2014207811 A1 | 12/2014 |

* cited by examiner

PRIOR ART

| | INPUT PRARMETER SETUP | |
|---|---|---|
| 310 — Preset | Vcc=1200V ▽ | |
| 320 — Gate Driver ID | ▽ | ✓ |
| 330 — IGBT Product | SKM200GB ▽ | ✓ |
| 340 — Number of IGBT Modules | 2 | |
| 350 — Switching Frequency fsw | | KHz |
| 360 — Applied Gate Resistor | | ohm |

DRIVING DEVICE OF GATE DRIVER

CROSS REFERENCE TO RELATED APPLICATIONS

This application claims the benefit of Korean Patent Application No. 10-2015-0100628, filed on Jul. 15, 2015, entitled "GATE DRIVER CIRCUIT FOR POWER SWITCHING DEVICE", which is hereby incorporated by reference in its entirety.

BACKGROUND

Technical Field

The present disclosure relates to a control device of a semiconductor switching element, and more particularly, to a control device of detecting an operation status of a switching element when an insulated gate bipolar transistor (IGBT) type switching element to which several thousand volts are applied is operated, such as a motor, an inverter, or a converter for various industrial applications, and operating at least one gate driver when driving the switching element based on the detected operation status.

Description of the Related Art

Generally, an IGBT type switching element for an industrial application may be classified based on characteristics such as a turn-on delay time, turn-off delay time, an amount of a current flowing at a collector terminal in a temperature range of 25 to 100 degrees Celsius (° C.), and the like. Also, a most popular VCE of the IGBT type switching element for an industrial application is in a voltage range of 600 to 1200 volts, and there is a tendency to use a VCE of 3300 volts.

That is, when an IGBT type switching element is used in industrial equipment such as a motor, an inverter, or a converter, a voltage between a collector terminal of the switching element and an emitter terminal thereof reaches several thousand volts. Also, an amount of a current flowing at the collector terminal may reach several hundred amperes (A).

FIG. 1 shows a control device of a typical semiconductor switching element.

Here, a user inputs a control instruction for operating a switching element to an interface (not shown), and the interface encodes input information. Thereafter, an encoded control signal is transmitted through an optical signal to a control unit 120 for controlling a switching element. At this point, encoded control information contained in the optical signal is converted into an electrical signal through an optical isolator 110. The optical signal containing the control information is converted into the electrical signal such that it may be possible to decrease unnecessary electrical noise or a short circuit possibility between two systems.

The converted electrical signal is transmitted to the control unit 120, and the control unit 120 may implement a logic circuit for decoding the encoded signal to generate a control signal based on the decoded signal. And, the control signal based on the decoded signal may be output to a gate driver 130. The gate driver 130 transmits a signal (current) to a gate terminal of a switching element 140 based on the received input signal to activate a switching operation of the switching element 140.

However, there is a problem in which a current (IC) for commencing turn-on and turn-off operations, which flows at a collector terminal of the switching element, is varied according to a voltage VCE having a wider voltage range of the collector terminal and an emitter terminal of such an IGBT type switching element. In addition, a switching operation of the IGBT type switching element is affected by properties of internal resistor and capacitor thereof, and the same IGBT type switching elements may have performances different from each other according to environment (temperature) at which they are provided.

SUMMARY

Therefore, to address the problems described above, some embodiments of the present disclosure is to provide a driving device of a gate driver, which includes a plurality of gate drivers to output a gate signal corresponding to a high voltage when the high voltage is applied to a semiconductor switching element.

In addition, some embodiments of the present disclosure is to provide a user with a voltage applied to the semiconductor switching element, an amount of a current being input or output, or temperature information of the semiconductor switching element, and a circuit performing a switching operation to which such information is reflected.

In accordance with an embodiment of the present disclosure, a driving device of a gate driver driving a semiconductor switching element includes a gate driver unit configured to output a control signal to the semiconductor switching element, and a control unit configured to control an operation of the semiconductor switching element by operating at least one gate driver configuring the gate driver unit, wherein the control unit may operate the at least one gate driver based on a preset operation range of the semiconductor switching element and a detected operation status thereof.

At this point, the semiconductor switching element may include an insulated gate bipolar transistor (IGBT) type switching element.

In addition, the driving device of a gate driver according to some embodiments of the present disclosure further includes an interface connected to the control unit, wherein the interface may receive input information regarding an operation of the semiconductor switching element, or may provide a user with an operation status of the semiconductor switching element according to the received input information.

At this point, the interface may receive at least one information among a voltage to be applied to the semiconductor switching element, product information of the gate driver, product information of the semiconductor switching element, the number of semiconductor switching devices connected to the driving device of a gate driver, a switching frequency of the semiconductor switching element required for a power conversion, and a specific resistance of a gate terminal of the semiconductor switching element.

At this point, a measurement unit connected to the control unit is further included, wherein the measurement unit may measure a voltage applied to the semiconductor switching element, a current input to or output from the semiconductor switching element, and a temperature thereof, and may provide at least one of the measured information to the control unit or the interface.

At this point, the control unit may generate logic configuration data based on a programming regarding an operation of the semiconductor switching element and input by a user, or may implement a specific logic circuit according to the generated logic configuration data.

At this point, an insulation unit connected to the control unit is further included, wherein the insulation unit may block a flow of a direct current or an alternating current between the control unit and the gate driver unit, and may deliver a control signal output from the control unit to the gate driver unit.

At this point, all or some of gate drivers configuring the gate driver unit may output a control signal to the semiconductor switching element through a common output terminal.

At this point, the control unit may control a combination of all or some of the gate drivers to make a sum of signals output from the combination thereof as an input signal of the gate terminal of the semiconductor switching element.

At this point, each of the gate drivers of the gate driver unit may receive multiple signals from the control unit via the insulation unit to output an output signal through a combination of the multiple signals.

At this point, each of the gate drivers of the gate driver unit may include the same performance or the same characteristic.

At this point, a clamping diode connected to the semiconductor switching element is further included, and the clamping diode may connected to the gate terminal of semiconductor switching element so as to enable the voltage applied thereto to be maintained constantly.

At this point, a direct current (DC)/DC converter connected to the gate driver unit is further included, wherein the DC/DC converter may receive an electrical power from an external power supply to output the electrical power to each of modules related to the operation of the semiconductor switching element.

In accordance with some embodiments of the present disclosure, it is provided effectiveness in which a plurality of gate drivers are included so as to operate a semiconductor switching element so that a gate signal corresponding to a high voltage is output to the semiconductor switching element when the high voltage is applied thereto.

Also, in accordance with some embodiments of the present disclosure, a voltage applied to the semiconductor switching element, an amount of a current being input or output, and temperature information of the semiconductor switching element are measured, so that a switching operation to which such measured information is reflected is effectively performed.

BRIEF DESCRIPTION OF DRAWINGS

FIG. 3 is a diagram illustrating a first operation of an interface 290 according to an embodiment of the present disclosure.

DETAILED DESCRIPTION

Figure 1:
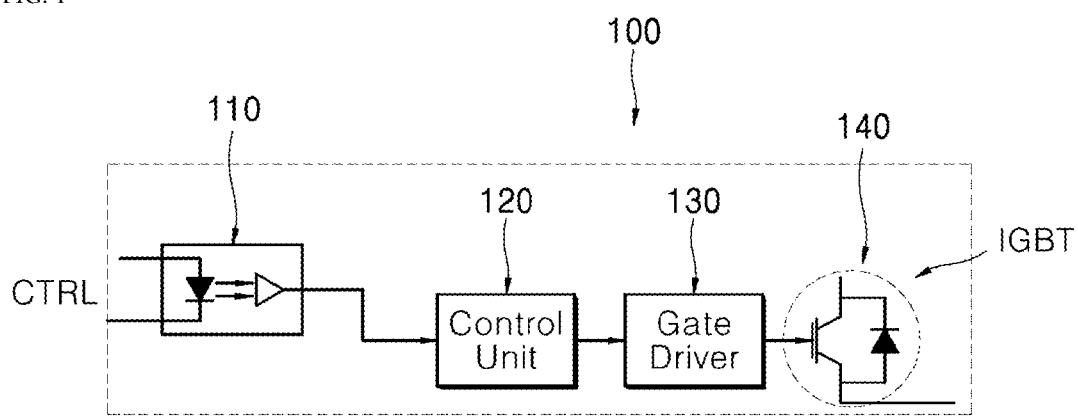
FIG. 1 is a diagram illustrating a typical insulated gate bipolar transistor (IGBT) type gate driver control device, according to the prior art.

Hereinafter, embodiments disclosed herein will be described in detail with reference to the accompanying drawings, and the same or like components refer to the same reference numerals regardless of given reference numerals and duplicated description thereof will be omitted.

Also, a driving device of a gate driver of a semiconductor type switching element in relation with the present disclosure will be described in more detail with reference to the accompanying drawings. In the following description, the terms of "module" and "unit" with respect to components are merely given by considering only easiness of describing the present disclosure, and these terms themselves do not represent specific meanings or functions. Therefore, it should be understood that the terms of "module" and "unit" may be used interchangeably.

Hereinafter, embodiments according to the present disclosure will be described in detail with reference to the accompanying drawings.

Figure 2:
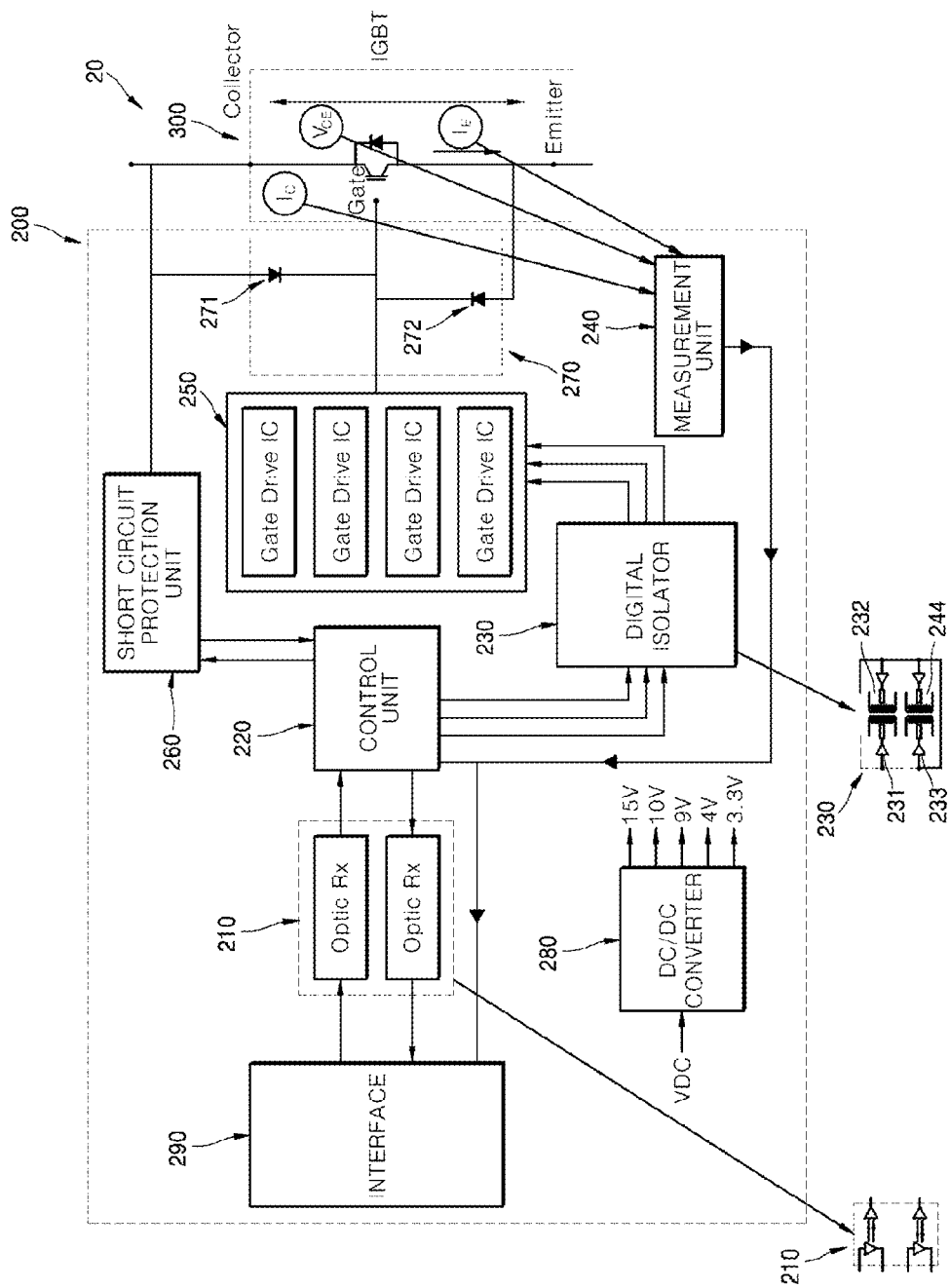
FIG. 2 is a diagram illustrating a driving device 200 of a gate driver of a semiconductor switching element according to an embodiment of the present disclosure.

FIG. 2 shows a power semiconductor module 20 including a driving device 200 of an insulated gate bipolar transistor (IGBT) type gate driver according to some embodiments of the present disclosure.

The driving device 200 of a gate driver according to some embodiments of the present disclosure may include a gate driver unit 250 for outputting a control signal to a semiconductor switching element 300, and a control unit 220 for detecting an operation status of the switching element 300 and driving at least one driver configuring the gate driver unit 250 based on the detected operation status to control a switching operation of the switching element 300.

As one embodiment of the present disclosure, the control unit 220 may drive the at least one gate driver based on a predetermined operation range of the switching element 300 and the detected operation status.

The control unit 220 may receive operation information of the switching element 300 from a user through an interface 290, and provide an operation status of the switching element 300 to the user.

The interface 290 serves as a channel for all external devices connected to a terminal of the user. The user may input information what the user wants to transmit to the driving device 200 of a gate driver through the interface 290.

That is, the interface 290 may be implemented by a circuit which connects the terminal of the user and the driving device 200 of a gate driver to each other.

Alternatively, the interface 290 may be implemented by one among a key pad, a dome switch, a touch pad, a jog wheel, a switch as a part of the driving device 200 of a gate driver. Also, the user may directly input information to the driving device 200 of a gate drive through the interface 290 without using the terminal.

In the former case or the latter case, the user may transmit a frequency of a control signal with respect to the switching element 300, a wavelength of the control signal with respect thereto, or information related to a start time or an end time of a positive half wavelength component of the control signal with respect thereto to the control unit 220 by directly inputting data information through the interface 290, or by touching a key pad and the like.

The control unit 220 outputs logic configuration data reflecting the input information by the user through a preset programming. Thereafter, in order to implement a specific logic circuit according to the logic configuration data, software implementation and hardware implementation may be combined.

With the software implementation, embodiments such as procedures and functions to be described herein may be implemented by separate software modules.

Each of the software modules may perform one or more functions and operations to be described herein. A software code may be implemented by a software application written an appropriate program language. The software code may be stored in a memory (not shown), and may be executed by the control unit 220.

With the hardware implementation, the control unit 220 includes at least one among application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, and electrical units for performing other functions.

Through such a combined configuration, the control unit 220 receives information regarding the switching element 300, information of gate drivers configuring the gate driver unit 250, and information of a voltage applied to the switching element 300 or a switching frequency and the like what the user wants thereof from the user. Thereafter, the control unit 220 may configure a specific logic circuit for performing a switching operation of the switching element 300, or may transmit operation information to the gate driver unit 250.

As one embodiment of the present disclosure, the control unit 220 may calculate information regarding a minimum magnitude of a gate current signal required by the switching element 300 or the number of gate drivers required for driving the switching element 300, and provide the information to the user through the interface 290.

A measurement unit 240 according to some embodiments of the present disclosure measures at least one of a voltage applied to the semiconductor switching element 300, an amount of a current input to the collector terminal of the switching element 300 or flowing at the emitter terminal thereof, and a temperature measured at the switching element 300. Thereafter, the measured result may be transmitted to the control unit 220 or the interface 290.

As one embodiment of the present disclosure, the user may update the previously input information regarding the frequency of the control signal, the wavelength thereof, or the start time or end time of the positive half wavelength component of the control signal through the transmitted information to provide to the control unit 220 through the interface 290.

The control unit 220 may grasp an error between information measured by the measurement unit 240 and an output estimated by the user to calculate input data for reducing the error to a minimum.

The calculated error or the calculated input data may be provided to the user. The control unit 220 may reconfigure the specific logic circuit for reducing the error or transmit the updated operation information to the gate driver unit 250.

With such an operation, there is effectiveness in which internal/external characteristics of an actual switching device may be reflected to a gate signal being input to the switching element 300, thereby exactly implementing a switching operation of the switching element 300 what the user wants to.

The typical gate driving device includes driven unilaterally a switching element connected thereto through a gate driver. However, the control unit 220 may exactly control an operation of the switching element 300 in real time through information provided from the measurement unit 240.

The optical isolator 210 disposed between the control unit 220 and the interface 290 blocks flows of a direct current and an unnecessary alternating current which are applied to each of circuit systems of the driving device 200 of a gate driver and the interface 290. Consequently, there is effectiveness in which transmitting and receiving signals between the control unit 220 and the interface 290 may be delivered with no noise.

Figure 4:
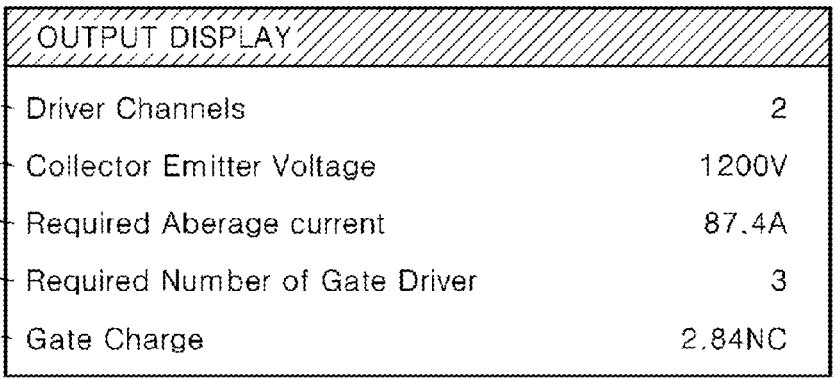
FIG. 4 is a diagram illustrating a second operation of the interface 290 according to an embodiment of the present disclosure.

With reference to FIGS. 3 and 4, it will be described that the interface 290 receives particularly what information from the user, and also it shows what information and in what manner to the user.

The control unit 220 is electrically connected to the gate driver unit 250.

As one embodiment of the present disclosure, the control unit 220 receives a voltage applied to the switching element 300 and information regarding the gate driver unit 250. Then, the number of gate drivers required for a switching of the switching element 300 or an amount of a current to be supplied to the gate terminal of the switching element 300 may be calculated.

A plurality of gate driver integrated circuits (ICs) configuring the gate drive unit 250 receive a signal output from the control unit 220. At this point, the signal output from the control unit 220 may pass a digital isolator 230.

The digital isolator 230 may block flows of a direct current and an unnecessary alternating current which are applied to each of the circuit systems of the control unit 220 and the gate driver unit 250, and may prevent danger in which each of the circuit system is grounded to generate a short circuit.

The control unit 220 and a short protection circuit unit 260 are electrically connected to each other, and the short protection circuit unit 260 may recognize an overcurrent flowing at the IGBT switching element to transmit the recognized information to the control unit 220.

The control unit 220 may determine whether or not the overcurrent is a predetermined maximum allowable current (a short circuit current), and then transmit a control signal corresponding thereto, thereby protecting the switching element 300 from a short circuit current.

An output terminal of the gate driver unit 250 is connected to the gate terminal of the IGBT switching element 300, so that the switching element 300 may perform a turn-on or turn-off operation based on the output control signal.

Here, the gate driver unit 250 may include the plurality of gate driver ICs, and may provide an amount of a current for controlling a switching operation of the switching element 300.

For example, when a single gate driver is used in a semiconductor switching element to which several thousand volts are applied, there may occur a case in which an amount of a current to be output possibly to the semiconductor switching element does not reach an amount of a current required for a control thereof.

On the other hand, when the gate driver unit 250 configured with the plurality of gate driver ICs according to some embodiments of the present disclosure, an amount of a current (a gate signal) output from all or some of the plurality of gate driver ICs may be flexibly combined to output an amount of a current for an operation of the switching element 300. Therefore, even though a typical small-scale gate driver is used, a variety of semiconductor devices for industrial applications to which several hundred to thousand volts are applied may be controlled.

The gate driver unit 250 may be configured with n gate drivers including the same type. In effectiveness with such a configuration, when receiving input information (for example, an applied voltage of the switching element 300, a product number thereof, or the total number thereof), the control unit 220 may operate m gate drivers required to output an amount of a supply current necessary for the gate terminal of the switching device 300.

Also, the driving device 200 of a gate driver may include a direct current (DC)/DC converter 280 which generate an electric power required for each module such as the control unit 220, the digital isolator 230, the measurement unit 240, the gate driver unit 250 and the like.

In other words, the DC/DC converter 280 may receive an electric power from a single external power supply to output a plurality of electric powers which are supplied to each module related to an operation of the switching element 300.

In addition, as one embodiment of the present disclosure, the driving device 200 of a gate driver may further comprise a clamping diode 270. The clamping diode 270 may include a VCG clamping diode 271 for connecting a collector of the semiconductor type switching element 300 to a gate thereof, and a VGE clamping diode 272 for connecting the gate of the semiconductor type switching element 300 to an emitter thereof.

The clamping diode 270 may be connected to the gate terminal of the switching element 300 so as to enable a voltage applied to the switching element 300 to be maintained constantly.

FIG. 3 shows a first operation of the driving device 200 of a gate driver according to an embodiment of the present disclosure.

As one example of some embodiments of the present disclosure, the control unit 220 may receive input information for operating the switching element 300 from the user through the interface 290.

In other words, the interface 290 may receive at least one information of a voltage 310 to be applied to the switching element 300, product information 320 of a gate driver installed at the driving device 200 of a gate driver, a product number 330 of the switching element 300, the number 340 thereof connected to the driving device 200 of a gate driver, a switching frequency 350 of the switching element 300 required for a power conversion, and a specific resistance 360 including the gate of the switching element 300.

As looking at FIG. 2, the information may be utilized as input information for effectively controlling the switching element 300 by the control unit 220.

FIG. 4 is a diagram illustrating a second operation of the driving device 200 for a gate driver according to an embodiment of the present disclosure.

As one example of some embodiments of the present disclosure, the control unit 220 may provide information, which is calculated based on information input by the user or is detected, to the user through the interface 290.

As one example of some embodiments of the present disclosure, on the basis of the input information of the user shown in FIG. 3, the control unit 220 may display at least one information among an operable gate driver channel 410, a voltage 420 applied to the switching element 300, an amount of a current required for the gate terminal of the switching element 300 so as to perform a switching operation required by the user, the number of gate drivers of the gate driver unit 250 required for an operation of the switching element 300, and the number of charges measured at the switching element 300 through the interface 290.

Figure 5:
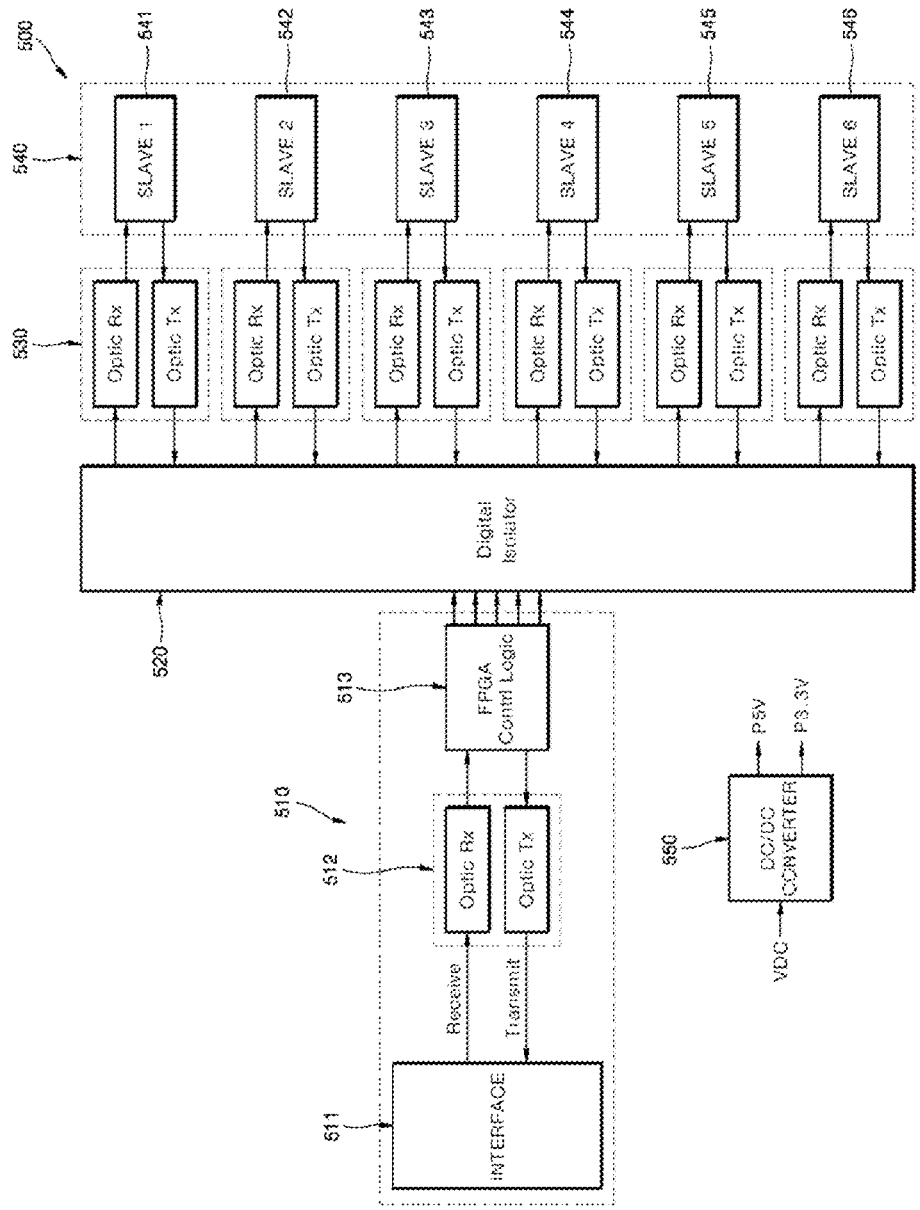
FIG. 5 is a diagram illustrating a power semiconductor module including a gate driving device according to an embodiment of the present disclosure.

FIG. 5 shows a power semiconductor module including a driving device of a gate driver according to another embodiment of the present disclosure.

Here, each of a plurality of slave modules 541, 542, 543, 544, 545, and 546 configuring a slave module unit 540 may include the driving device 200 of a gate driver and the semiconductor type switching element 300 which are shown in FIG. 2. Also, the plurality of slave modules 541, 542, 543, 544, 545, and 546 may be controlled by a master module 510.

As one embodiment of the present disclosure, the master module 510 may include an interface 511 including a structure and a function similar to those of the interface 290 shown in FIG. 2, an optical isolator 512 similar to the optical isolator 210 of FIG. 2, and a field programmable gate array (FPGA) control logic 513 serving a function of the control unit 220 of FIG. 2.

The FPGA control logic 513 may generate logic configuration data based on information input through the interface 511, or implement a specific circuit according to the generated data. The input information may include information related to all or some of the plurality of slave modules 541, 542, 543, 544, 545, and 546.

As one embodiment of the present disclosure, the user may input information through the interface 511 included in the master module 510 so as to operate all or some of the plurality of slave modules 541, 542, 543, 544, 545, and 546.

Here, a communication method between the interface 511 and the FPGA control logic 513 through the optical isolator 512 may be similar to that between the interface 290 and the control unit 220 which are shown in FIG. 2.

After the input information provided through the interface 511 is input, the FPGA control logic 513 may provide output information regarding the selected driving driver to the user, or drive the selected modules.

Here, the FPGA control logic 513 directly drive the selected driving device or provide the input information provided from the user to a control unit (not shown) in the selected driving device to indirectly drive the selected modules.

Therefore, it may reduce an inconvenience of the user to control the plurality of slave modules 541, 542, 543, 544, 545, and 546 one by one, thereby providing effectiveness in which efficiency of a control is raised.

Some embodiments of the present disclosure includes a plurality of gate drivers so as to operate a semiconductor switching element so that it may provide effectiveness in which a gate signal corresponding to a high voltage is output to the semiconductor switching element when the high voltage is applied thereto.

Also, by measuring a voltage applied to the semiconductor switching element, an amount of a current being input or output, or temperature information of the semiconductor switching element, a switching operation to which the measured information is reflected may be effectively performed.

While certain embodiments include been described, these embodiments include been presented by way of example only, and are not intended to limit the scope of the protection. Indeed, the novel methods and systems described herein may be embodied in a variety of other forms. Furthermore, various omissions, substitutions and changes in the form of the methods and systems described herein may be made without departing from the spirit of the protection. The accompanying claims and their equivalents are intended to cover such forms or modifications as would fall within the scope and spirit of the protection. Various components illustrated in the figures may be implemented as hardware and/or software and/or firmware on a processor, ASIC/FPGA, dedicated hardware, and/or logic circuitry. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A driving device configured to drive a semiconductor switching element, comprising:
   a gate driver unit comprising a plurality of gate drivers configured to output a control signal to the semiconductor switching element; and
   a control unit configured to control an operation of the semiconductor switching element by operating at least one gate driver in the plurality of gate drivers,
   wherein the control unit is further configured to calculate an amount of a supply current to be supplied to a gate terminal of the switching element and a number of gate drivers required to output the supply current based on a preset operation range of the semiconductor switching element and a detected operation status and operate the gate drivers corresponding to the number of gate drivers required to output the supply current.

2. The driving device of claim 1, wherein the semiconductor switching element includes an insulated gate bipolar transistor (IGBT) type switching element.

3. The driving device of claim 1, further comprising:
   an interface connected to the control unit,
   wherein the interface is further configured to receive input information regarding an operation of the semiconductor switching element or provide a user with an operation status of the semiconductor switching element according to the received input information.

4. The driving device of claim 3, wherein the input information comprises at least one of: a voltage to be applied to the semiconductor switching element, product information of the gate drivers, product information of the semiconductor switching element, the number of semiconductor switching devices connected to the driving device, a switching frequency of the semiconductor switching element required for a power conversion, or a specific resistance of a gate terminal of the semiconductor switching element.

5. The driving device of claim 3, further comprising:
   a measurement unit connected to the control unit,
   wherein the measurement unit is further configured to measure a voltage applied to the semiconductor switching element, a current input to or output from the semiconductor switching element, and a temperature, and provide at least one of the measured information to the control unit or the interface.

6. The driving device of claim 1, wherein the control unit is further configured to generate logic configuration data based on a programming regarding an operation of the semiconductor switching element and input by a user, or implement a specific logic circuit according to the generated logic configuration data.

7. The driving device of claim 1, further comprising:
   an insulation unit connected to the control unit,
   wherein the insulation unit is further configured to block a flow of a direct current or an alternating current between the control unit and the gate driver unit, and deliver a control signal output from the control unit to the gate driver unit.

8. The driving device of claim 1, wherein at least some of gate drivers of the plurality of gate drivers are configured to cause the gate driver unit to output a control signal to the semiconductor switching element through a common output terminal.

9. The driving device of claim 8, wherein the control unit is further configured to control a combination of at least some of the gate drivers to make a sum of signals output from the combination as an input signal of the gate terminal of the semiconductor switching element.

10. The driving device of claim 7, wherein at least some of gate drivers of the plurality of gate drivers are configured to cause the gate driver unit to receive multiple signals from the control unit via the insulation unit to output an output signal through a combination of the multiple signals.

11. The driving device of claim 1, wherein each of the plurality of gate drivers includes the same performance or the same characteristic.

12. The driving device of claim 1, further comprising:
   a clamping diode connected to the semiconductor switching element,
   wherein the clamping diode is connected to the gate terminal of the semiconductor switching element so as to enable the voltage applied thereto to be maintained constantly.

13. The driving device of claim 1, further comprising:
   a direct current DC/DC converter connected to the gate driver unit,
   wherein the DC/DC converter is further configured to receive an electrical power from an external power supply to output the electrical power to each of modules related to the operation of the semiconductor switching element.

* * * * *